(12) United States Patent
Shamouilian et al.

(10) Patent No.: US 6,682,627 B2
(45) Date of Patent: Jan. 27, 2004

(54) PROCESS CHAMBER HAVING A CORROSION-RESISTANT WALL AND METHOD

(75) Inventors: Shamouil Shamouilian, San Jose, CA (US); Jennifer Y. Sun, Sunnyvale, CA (US); Ananda H. Kumar, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 86 days.

(21) Appl. No.: 09/962,626

(22) Filed: Sep. 24, 2001

(65) Prior Publication Data

US 2003/0056897 A1 Mar. 27, 2003

(51) Int. Cl.$^7$ .............................. H05H 1/00; C23C 16/00
(52) U.S. Cl. .......................... 156/345.1; 156/345.51; 118/715; 118/728; 118/732; 118/733
(58) Field of Search .................. 156/345.1, 345.51, 156/345.48, 345.47, 345.41; 118/715, 728, 732, 733, 723 I, 723 E, 723 MW

(56) References Cited

U.S. PATENT DOCUMENTS

| | | | |
|---|---|---|---|
| 4,384,918 A | 5/1983 | Abe | |
| 4,480,284 A | 10/1984 | Tojo et al. | |
| 4,645,218 A | 2/1987 | Ooshio et al. | |
| 4,665,463 A | 5/1987 | Ward et al. | |
| 4,832,781 A | 5/1989 | Mears | |
| 4,949,671 A | 8/1990 | Davis et al. | |
| 5,055,964 A | 10/1991 | Logan et al. | |
| 5,073,716 A | 12/1991 | Clemens et al. | |
| 5,104,834 A | 4/1992 | Watanabe et al. | |
| 5,117,121 A | 5/1992 | Watanabe et al. | |
| 5,151,845 A | 9/1992 | Watanabe et al. | |
| 5,166,856 A | 11/1992 | Liporace et al. | |
| 5,191,506 A | 3/1993 | Logan et al. | |
| 5,275,683 A | 1/1994 | Arami et al. | |
| 5,280,156 A | 1/1994 | Niori et al. | |
| 5,315,473 A | 5/1994 | Collins et al. | |
| 5,324,053 A | 6/1994 | Kubota et al. | |
| 5,325,261 A | 6/1994 | Horwitz | |
| 5,350,479 A | 9/1994 | Collins et al. | |
| 5,366,585 A | 11/1994 | Robertson et al. | |
| 5,382,469 A | 1/1995 | Kubota et al. | |

(List continued on next page.)

FOREIGN PATENT DOCUMENTS

| | | |
|---|---|---|
| EP | 635869 A1 | 4/1994 |
| EP | 439000 A1 | 9/1994 |
| EP | 0 967 838 A1 | 12/1999 |
| JP | 01095227 | 4/1989 |
| JP | 4367247 | 12/1992 |
| JP | 07023859 | 1/1995 |
| JP | 227748 | 1/1999 |

OTHER PUBLICATIONS

RD–31352, Research Disclosure, May 1990.*

Daviet, et al., "Electrostatic Clamping Applied to Semiconductor Plasma Processing—I. Theoretical Modeling," *J. Electrochem. Soc.*, 140(11):3245–3255 (Nov. 1993).

Daviet, et al., "Electrostatic Clamping Applied to Semiconductor Plasma Processing—II. Experimental Results," *J. Electrochem. Soc.*, 140(11):3256–3261 (Nov. 1993).

(List continued on next page.)

*Primary Examiner*—Parviz Hassanzadeh
(74) *Attorney, Agent, or Firm*—Ashok Janah; Joseph Bach

(57) ABSTRACT

A substrate processing chamber has a substrate support, a gas supply, a gas exhaust, a gas energizer, and a wall about the substrate support, the wall having a porous ceramic material at least partially infiltrated with a fluorinated polymer, whereby a substrate on the substrate support may be processed by gas introduced by the gas supply, energized by the gas energizer, and exhausted by the gas exhaust.

32 Claims, 2 Drawing Sheets

U.S. PATENT DOCUMENTS

| | | | |
|---|---|---|---|
| 5,641,375 | A | 6/1997 | Nitescu et al. |
| 5,684,669 | A | 11/1997 | Collins et al. |
| 5,792,562 | A | 8/1998 | Collins et al. |
| 5,798,148 | A | 8/1998 | Thomas et al. |
| 5,800,871 | A | 9/1998 | Collins et al. |
| 5,916,689 | A | 6/1999 | Collins et al. |
| 6,027,629 | A | 2/2000 | Hisamoto et al. |
| 6,110,283 | A | 8/2000 | Yamamuka et al. |
| 6,165,313 | A | 12/2000 | Winters et al. |
| 6,182,603 | B1 * | 2/2001 | Shang et al. ......... 118/723 ME |
| 6,277,759 | B1 * | 8/2001 | Blalock et al. ............. 438/706 |
| 2002/0066532 | A1 * | 6/2002 | Shih et al. ............... 156/345.1 |

OTHER PUBLICATIONS

Nakasuji, et al., "Low Voltage and High Speed Operating Electrostatic Wafer Chuck," *J. Vac. Sci. Technol. A..*, 10(6):3573–3578 (Nov./Dec. 1992).

Watanabe, et al., "Effect of Additives on the Electrostatic Force of Alumina Electrostatic Chucks," *J. of the Ceramic Soc. of Jpn*, 100(1):1–6 (1992).

Watanabe, et al., "Electrostatic Force and Absorption Current of Alumina Electrostatic Chuck," *Jpn. J. Appl. Phys.*, 31(Pt. 1, No. 7):2145–2150 (1992).

Watanabe, et al., "Relationship between Electrical Resistivity and Electrostatic Force of Alumina Electrostatic Chuck," *Jpn. J. Appl. Phys.*, 32(Pt. 1, No. 2):864–871 (1993).

Watanabe, et al., "Resistivity and Microstructure of Alumina Ceramics Added with $TiO_2$ Fired in Reducing Atmosphere," *J. of the Ceramic Soc. of Jpn Int. Ed.*, 101:1076–1083.

Wright, et al., "Low Temperature Etch Chuck: Modeling and Experimental Results of Heat Transfer and Wafer Temperature," *J. Vac. Sci. Technol. A*, 10(4):1065–1070 (Jul./Aug. 1992).

IBM Technical Disclosure Bulletin, "Electrostatic Wafer Holder for Wafer Cooling During Reactive Ion Etching", vol. 31, No. 1, Jun. 1988.

U.S. Patent Application entitled, "Electrostatic Chuck with Erosion–Resistant Electrode Connection"; filed Feb. 22, 1994; Ser. No. 08/199,916; Inventors: Shamouilian, et al.

* cited by examiner

US 6,682,627 B2

PROCESS CHAMBER HAVING A CORROSION-RESISTANT WALL AND METHOD

BACKGROUND

This invention relates to a chamber for processing substrates.

In the processing of substrates, such as substrate etching processes, deposition processes, and cleaning processes, gases such as halogen or oxygen gases, are used. The gases, especially when they are energized, for example by RF or microwave energy, can corrode components of the chamber, such as the chamber wall. For example, unprotected chamber walls made of aluminum can corrode in halogen gases to form undesirable halogenated gaseous byproducts, such as $AlCl_3$ or $AlF_3$. Excessive corrosion and degradation of the chamber walls can require frequent repair or replacement of the chamber or the chamber walls which is undesirable. Corrosion of chamber walls can also result in flaking of the corroded portions of the walls and such flakes can fall upon and contaminate the substrate. Thus, reducing corrosion of the chamber walls is desirable to reduce chamber downtime, limit the frequency of repair or replacement of the chamber wall, and improve substrate yields.

The gases may also react with the chamber wall to form deposits of process residues and corrosion byproducts on the walls that, in time, peel off and fall on the substrate. The deposit formation also necessitates frequent cleaning of the chamber walls and resultant chamber downtime. The chamber downtime is undesirable, especially in the competitive semiconductor industry.

Thus, there is a need for a chamber having a corrosion resistant wall that is able to resist corrosion when exposed to corrosive gas, and in particular corrosive plasmas. There is also a need for corrosion resistant chamber walls that reduce the contamination of substrates from process residues and by-products that accumulate on the chamber walls.

SUMMARY

A substrate processing chamber wall comprises a composite structure including a porous ceramic material at least partially infiltrated with a fluorinated polymer.

A substrate processing chamber comprises a substrate support, a gas supply, a gas exhaust, a gas energizer, and a wall about the substrate support, the wall comprising a porous ceramic material at least partially infiltrated with a fluorinated polymer, whereby a substrate on the substrate support may be processed by gas introduced by the gas supply, energized by the gas energizer, and exhausted by the gas exhaust.

A method of manufacturing a chamber wall comprises forming a wall comprising a porous ceramic material, and at least partially infiltrating the porous ceramic material with a fluorinated polymer.

DRAWINGS

These and other features, aspects, and advantages of the present invention will become better understood with regard to the following description, appended claims, and accompanying drawings which illustrate examples of the invention, where:

DESCRIPTION

Figure 1:
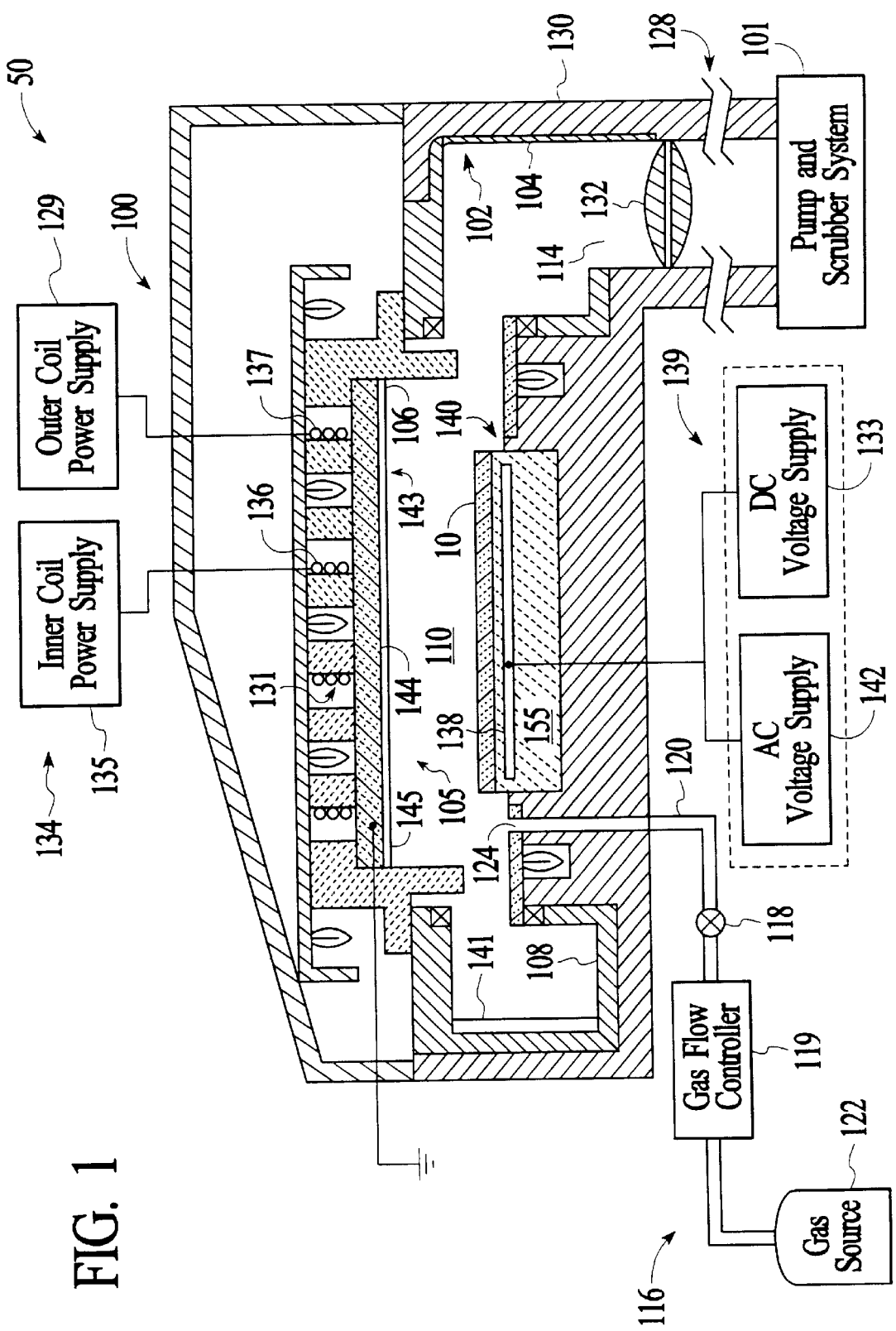
FIG. 1 is a sectional schematic view of an embodiment of an apparatus according to the present invention.

An embodiment of an apparatus 50 and process chamber 100 for processing a substrate 10 is schematically illustrated in FIG. 1. The particular embodiment of the process chamber 100 shown herein suitable for processing substrates 10, such as semiconductor wafers, is provided only to illustrate the invention, and should not be used to limit the scope of the invention. Generally, the apparatus 50 comprises a process chamber 100 that includes a chamber wall 102. The chamber wall 102 may be a portion of an enclosure for a substrate, such as an enclosure wall, for example, one or more of annular sidewalls 104, a bottom wall 108, a ceiling 106 or a liner 141, that cooperate to enclose and define a chamber volume defined by the process zone 110 that is above and about the substrate 10. The chamber wall 102 may have a number of suitable shapes. For example, the ceiling 106 may comprise a shape which is domed, conical, or substantially planar. In a desirable version, the ceiling 106 is substantially planar, for example, a flat lid.

A gas, for example, a process or cleaning gas, is introduced into the chamber 100 by a gas supply 116 comprising a gas flow controller 119 and valve 118 for controlling the flow of gas through a gas feed conduit 120 that transports the gas from a process gas source 122 to a gas outlet 124 in the chamber 100. The gas outlet 124 may be located peripherally around a substrate 10 (as shown) or near the ceiling 106 of the chamber 100 (not shown). The gas introduced in the chamber 100 is exhausted by a gas exhaust 128 that includes an exhaust conduit 114, an exhaust line 130, a throttle valve 132, and a pump and scrubber system 101 which may include scrubbers, roughing pumps and turbo-molecular pumps. The exhaust conduit 114 is an aperture or channel that receives the gas to be exhausted from the chamber 100, and that is typically positioned around the periphery of the substrate 10. The exhaust line 130 connects the exhaust conduit 114 to the pump and scrubber system 101, and the throttle valve 132 in the exhaust line 130 may be used to control the pressure of gas in the chamber 100.

An energized gas is formed from the gas introduced into the chamber 100 by a gas energizer 134 that couples electromagnetic energy into the process zone 110 of the chamber 100. A suitable gas energizer 134 may comprise an inductor antenna 131 covering the ceiling 106 of the chamber 100. The inductor antenna 131 may comprise, for example, an inner coil 136 and an outer coil 137 and one or more power supplies 135, 129 which provide power to the inductor coils 136, 137. In one version, the coils 136, 137 may have a circular symmetry about the chamber 100, the arrangement and number of the coils 136, 137 being selected to provide the desired product of current and antenna turns (d/dt)(N·1) near the ceiling 106 to provide a good inductive flux into the plasma. In this version, the ceiling 106 is adapted to be at least partially permeable to RF energy generated by the inductor coils 136, 137.

Electromagnetic energy is capacitively coupled into the process zone 110 of the chamber 100 by a gas energizer 134 comprising electrodes 105, 138 that may be electrically biased relative to one another to energize the gas in the chamber 100. For example, the chamber wall 102 may comprise a first electrode 105 that operates with a second electrode 138 below the substrate 10 and within a substrate support 140, to couple electromagnetic energy to the gas in the chamber 100. The first and second electrodes 105, 138 may be electrically biased relative to one another by an electrode voltage supply 139 that includes an AC voltage supply 142 for providing a plasma generating RF voltage to the second electrode 138. The AC voltage supply 142 may provide an RF generating voltage having one or more frequencies from 50 KHz to 60 MHz, and desirably about 2 MHz. The power level of the RF bias current applied to the electrodes 105, 138 may be from about 50 to about 3000 Watts.

The second electrode 138 may also be embedded in a dielectric 155 so that the electrode 138 can electrostatically hold the substrate 10. The DC voltage supply 133 may provide a chucking voltage to the second electrode 138 to form an electrostatic charge that holds the substrate 10 to the substrate support 140. For electrostatic clamping, the second electrode 138 may be in a monopolar or bipolar electrode configuration. Typically, the second electrode 138 is made from an electrically conducting material, such as a metal, for example, aluminum, copper, gold, molybdenum, tantalum, titanium, tungsten, and alloys thereof, and may also be fabricated from a high melting point refractory metal, such as tungsten, tantalum or molybdenum. Molybdenum has a good thermal conductivity and resistance to corrosion in non-oxidizing environments. Generally, the second electrode 138 comprises a generally planar shape and is shaped and sized according to the shape and size of the substrate 10. Typically, for a circular substrate 10 having a diameter of about 200 mm, a suitable diameter of the second electrode 138 may be from about 180 to about 220 mm, and for a substrate 10 having a diameter of about 300 mm, a suitable diameter of the second electrode 138 may be from about 280 to about 320 mm. For example, the second electrode 138 may be a mesh of electrically conducting wire (not shown) that extends below substantially the entire substrate 10 and is embedded in the dielectric 155.

The chamber 100 has a chamber wall 102 that is shaped to form a portion of an enclosure about the substrate 10, and that comprises a composite structure 143 comprising a porous ceramic material 144 that is at least partially infiltrated with a fluorinated polymer 145. In one version, the chamber wall 102 is about regions of the chamber 100 at which the wall 102 is at least partially exposed to the gas in the chamber 100. For example, the chamber wall 102 may be formed as the ceiling 106. The ceiling 106 may be especially susceptible to erosion from the energized process gas formed in the process zone 110 of the chamber 100 because of the exposure of the ceiling 106 to the energized process gas. The ceiling 106 may also be susceptible to corrosion when RF energy is passed through the ceiling to energize the process gas in the process zone 110, for example when an inductor antenna 131 is arranged about an external surface of the ceiling 106. Also, in certain chamber designs, the ceiling 106 may be electrically biased to serve as a process electrode, and in these chambers, the ceiling 106 may be rapidly corroded by the energized gas. However, the chamber wall 102 may also form other regions of the chamber 100, for example, the sidewall 104 or bottom wall 108 of the chamber 100.

In another version, the chamber wall 102 is a liner 141 that may cover at least a portion of an underlying surface about the substrate 10, for example, a portion of the chamber wall 102 which is susceptible to corrosion or erosion by the energized process gas, to enhance the chemical or physical corrosion or erosion resistance of the chamber wall 102. The liner 141 may be fabricated such that it can be easily removed from the chamber 100 so that, for example, the liner 141 may be cleaned of any process residues without performing a cleaning process in the chamber 100. Also, removable liners 141 having a build up of hard or difficult to remove process residues may be easily removed from the chamber 100 and replaced with new liners 141.

Figure 2:
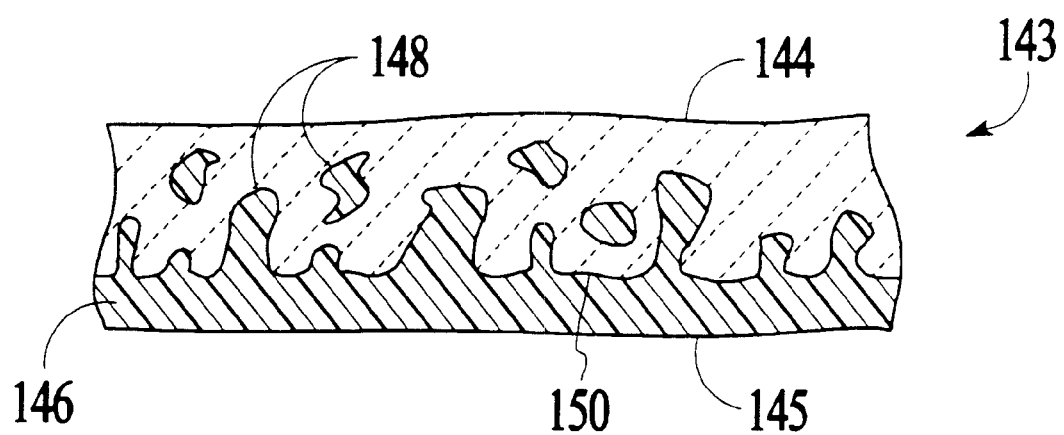
FIG. 2 is a partial sectional schematic side view of a chamber wall comprising a composite material according to the present invention.

FIG. 2 schematically illustrates the composite structure 143 comprising the porous ceramic material 144 having the fluorinated polymer 145 at least partially infiltrated into, or embedded in, the porous ceramic material 144. The porous ceramic material 144 comprises pores 148, at least some of which may be open to a surface 150 of the porous ceramic material 144. The fluorinated polymer 145 may be infiltrated into the porous ceramic material 144 such that the pores 148 in the porous ceramic are at least partially filled by the fluorinated polymer. For example, the infiltrated fluorinated polymer 145 may at least partially fill pores 148 that are open to the surface 150 of the porous ceramic material and may even at least partially fill pores 148 which are in the interior of the porous ceramic material 144. In one version, the fluorinated polymer 145 forms a coating 146 on the surface of the porous ceramic material 144 that is at least partially infiltrated into the surface 150, and thus into the pores 148, of the porous ceramic 144.

It is believed that the composite structure 143 can provide corrosion resistance during the processing of substrates 10 at least in part from the adherence of process residues generated during substrate processing to the composite structure 143. For example, process residues comprising fluorocarbon polymer may adhere to portions of fluorinated polymer 145 in the composite structure 143 which are exposed to the energized gas in the process zone 422 110. The process residue that adheres to the fluorinated polymer 145 forms a barrier between the portion of the chamber wall 102 the process residue to the composite structure 143 on the chamber wall 102 reduces the contamination of substrates 10 being processed in the chamber 100, as the process residue adhered to the composite structure 143 is less likely to flake off and deposit on the substrates 10.

The process residue which adheres to the composite structure 143 may be cleaned from the chamber wall 102 during a chamber cleaning process. During the cleaning process, the process residues are removed from the chamber wall 102 by, for example, applying a solvent (wet cleaning) to the chamber wall 102, or by energizing a cleaning gas in the process zone 110 of the chamber 100. The composite structure 143 has been found to be resistant to corrosion during these cleaning processes, because the porous ceramic material 144 substantially inhibits the removal of the infiltrated fluorinated polymer from the chamber wall 102. The porous ceramic material 144 provides a sturdy matrix of material which limits access of the cleaning gas or solvent to the fluorinated polymer which is infiltrated into the pores 148 of the porous ceramic material 144. The corrosion resistance of the composite structure 145 during cleaning is also enhanced by the fluorinated polymer 145, as fluorinated polymers 145 have been discovered to have good resistance to corrosion during cleaning processes, such 83 those involving energized gases comprising oxygen containing gas. Thus, the composite structure 143 provides an corrosion resistant structure which provides corrosion resistance during both substrate processing and chamber cleaning.

In one version, the pores 148 of the porous ceramic material 144 may be filled with fluorinated polymer 145 to provide a volume fraction of fluorinated polymer 145 to porous ceramic material 144 of at least about 15%, and which may even be from about 15% to about 40%. These volume fractions of the fluorinated polymer 145 in the porous ceramic material 144 require the porous ceramic material 144 to have a suitable porosity level. In this version, it is desirable that the porous ceramic material 144 comprise pores 148 that provide a larger total pore volume that may be suitably filled with the fluorinated polymer 145. In one version, the percent porosity of the porous ceramic material 144 may be at least about 20%, or even from about 20% to about 45%. A good porosity level also provides good adhesion of the fluorinated polymer 145 to the porous ceramic material 144.

The porous ceramic material 144 is composed of a ceramic material that provides a rigid and durable structure in which the fluorinated polymer 145 may be embedded or infiltrated. The porous ceramic material 144 is also desirably at least partially resistant to corrosion in an energized gas environment. Suitable porous ceramic materials 144 may comprise, for example, one or more of aluminum oxide, aluminum nitride, boron nitride, boron carbide, yttrium oxide, cordierite, mullite, silicon nitride, silicon oxide, silicon carbide, glass ceramic, and mixtures thereof. For example, aluminum oxide and silicon carbide have been found to provide good corrosion resistance in energized gas environments comprising energized fluorine-containing or oxygen-containing gas.

The porous ceramic material 144 may be fabricated from a mixture of ceramic powders and a binder, which may be an organic binder material. The ceramic powder and binder may be shaped in a mold into a suitable ceramic preform by, for example, slip casting, or may be formed by ram pressing or isostatic pressing, or by tape casting. Thereafter, the shaped preform is sintered to form a sintered preform comprising hardened porous ceramic material 144. Suitable connector or other structures may be formed in the shaped preform prior to sintering. The sintered porous ceramic material 144 may also be ground to a desired thickness and other structures may also be drilled or machined into the porous ceramic material 144.

Optionally, the binder may comprise pore-forming agents to form pores 148 in the porous ceramic material 144. In one version, the shaped preform may harden around the pore-forming agents during sintering to form the pores 148 of a porous ceramic material 144. Suitable pore-forming agents may comprise, for example, spheres of polymeric materials, such as the polymeric material available under the trademark "Latex". The size, number and distribution of pore-forming agents may control the size, number and distribution of the pores 148 formed in the porous ceramic material 144.

Figure 3:
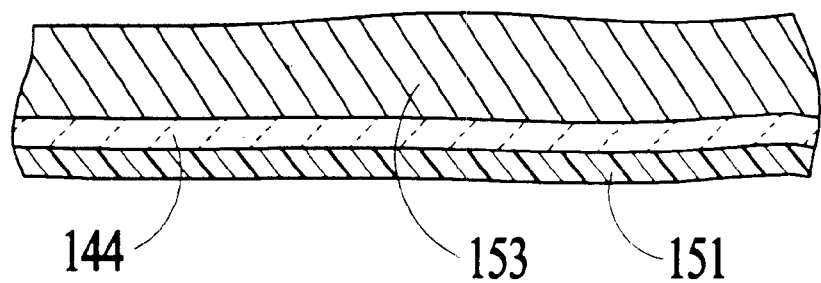
FIG. 3 is a partial sectional schematic side view of a chamber wall comprising a coating of a porous ceramic material according to an aspect of the present invention.

The porous ceramic material 144 may also be formed as a porous ceramic coating 151 on an underlying structure 153 which may be composed of another material, as shown in FIG. 3. For example, the porous ceramic coating 151 may be formed by plasma spraying a ceramic material on an underlying metal structure. In plasma spraying, a plasma is formed to atomize and at least partially liquefy a spray of particulate ceramic material injected through the plasma. For example, the plasma may liquefy the ceramic material by heating the ceramic material to a temperature of thousands of degrees Celsius. The liquified droplets of the ceramic material impinge at high velocities on the underlying metal structure and rapidly solidify to form the porous ceramic coating 151.

The fluorinated polymer 145 that is used to infiltrate the porous ceramic material 144 is desirably selected to be resistant to corrosion in an energized gas environment. For example, fluorinated polymers comprising a fluorine content of at least about 50% by weight, for example from about 50% to about 80% by weight, and even from about 67% to about 70% by weight have been found to demonstrate good corrosion resistance in energized gas environments, such as for example, energized gas environments comprising energized oxygen species. The fluorinated polymer 145 may also desirably have a softening point which is higher than the operating temperature of the chamber 100 to ensure that the material will not excessively soften or degrade during operation of the chamber 100.

In one version, the fluorinated polymer 145 may be selected to have a composition that is similar or complementary to the composition of process residues generated during processing of the substrates 10, thereby enhancing adherence of the process residues to the chamber wall 102. For example, the fluorinated polymer may comprise a fluorocarbon polymer to which process residues comprising similar fluorocarbon polymers may easily adhere.

The fluorinated polymer 145 may also desirably be formed from a material capable of penetrating the pores of the porous ceramic material 144. This allows the fluorinated polymer 145 to infiltrate and fill up a substantial volume of the pores 148 of the porous ceramic material 144. In one version the fluorinated polymer 145 comprises a polymer that is formed from a liquid polymerizable material. The "liquid polymerizable material" is a material which is liquid at or around room temperature and includes at least one monomer which is capable of being polymerized. The liquid polymerizable material can include a mixture of two or more polymerizable monomers if desired. For example, a suitable liquid polymerizable material may comprise polymerizable monomers comprising one or more of vinylidenefluoride ($CF_2CH_2$), hexafluoropropylene ($CF_3CFCF_2$) and tetrafluoroethylene ($CF_2CF_2$).

The liquid polymerizable material may desirably have a low viscosity and low surface tension to facilitate penetration of the liquid material into a porous ceramic material 144 to partially fill at least some of the pores 148 of the porous ceramic material 144. For example, a liquid polymerizable material having a sufficiently low viscosity is capable of penetrating an 0.1 to 1-mm thick sample of the porous ceramic material, in a time of up to about 1 to about 5 minutes. Penetration of the liquid polymerizable material through a porous ceramic material 144 can also be determined by visual or tactile inspection. Suitable viscosities for liquid polymerizable materials that penetrate predominantly microporous or fine pore ceramic materials are less than about 50 cps and more desirably from about 1 to about 50 cps. Materials having higher viscosities are suitable for penetrating and sealing predominantly macroporous ceramic materials 144 that have larger diameter pores. It is also desirable to cure the liquid polymeric materials at or about room temperature, and at pressures below about 1 atmosphere, and more desirably below about 100 mTorr.

The liquid polymerizable materials used to form the fluorinated polymer 145 may desirably also include one or more additives that may be added to polymerizable mixtures. Such additives include polymerization initiators, cure site monomers, crosslinkers, coagents, accelerators such as organic cyclic sulfimides, e.g., benzoic sulfimide (saccharin) and tertiary amines, e.g., N,N-dialkyltoluidenes such as N,N-dimethyl-p-toluidene, and chelating agents such as sodium EDTA (tetrasodium ethylenediaminetetraacetate). Solvents (desirably non-aqueous solvents) also may be used to further reduce the viscosity of the liquid polymerizable material.

The liquid polymerizable mixture that is cured to form the fluorinated polymer 145 may also include an effective amount of a polymerization initiator or combination of initiators. Such polymerization initiators may include free-radical polymerization initiators capable of initiating polymerization of the monomer or monomers of the mixture in the substantial absence of oxygen, and yet not initiate polymerization as long as oxygen is present. Suitable initiators include peroxy initiators, such as peroxides, hydroperoxides and peresters. Hydroperoxy initiators, in particular organic hydroperoxides such as cumene hydroperoxide are particularly desired. The amount of initiator used is an effective amount capable of initiating polymerization of the monomer or monomers in the liquid polymerizable mixture under the selected curing conditions (e.g., in air, in the absence of oxygen, etc.). Anaerobic initiators that initiate polymerization in the absence of oxygen but do not initiate polymerization if oxygen is present may be desirable. The amount of initiator is in general between about 0.1 and 10 percent by weight of the non-volatile components of the liquid polymerizable composition.

It is also desirable for the polymerizable mixture to have a low level of contaminants that can otherwise degrade the performance of substrates 10 that may be fabricated using a chamber 100 according to the present invention. Such contaminants include metals such as alkali and alkaline earth metals (e.g., sodium, potassium), iron, copper, zinc, etc. The amount of such contaminants in the polymerizable mixture desirably is less than about 1 ppm.

The liquid polymerizable material may be applied to the porous ceramic material 144 by, for example, brushing, spraying or dipping. The surface of the porous ceramic material 144 should be cleaned and dried prior to application of the liquid polymerizable material. In one version, the pores 148 of the porous ceramic material 144 are evacuated prior to applying the fluorinated polymer 145, thereby providing for the vacuum infiltration of the liquid polymerizable material into the pores 148. After the liquid polymerizable material is applied, it is cured in a curing step in which the liquid polymerizable material is polymerized, to form polymer within the pores 148 of porous ceramic materials 144. The curing step desirably may be performed for about 1 to about 10 hours at from about 80 to about 150° C. When the selected liquid polymerizable material is an anaerobically curable material, the curing step desirably is carried out in the absence of oxygen. The curing step may also be at least partially carried out under reduced pressure, for example, at pressures of about 100 mTorr or less. Curing can initially be carried out in the presence of air and at atmospheric pressure, followed by a continuation of the curing step in the absence of oxygen under reduced pressure. Curing the liquid polymerizable material under reduced pressure generally is beneficial in reducing the time required for cure. In the case of a porous ceramic material 144 the application and cure steps may also be repeated sequentially at least twice, in order to ensure that the pores 148 of the ceramic material are sufficiently filled with the fluorinated polymer.

A chamber wall 102 according to the present invention can provide good corrosion resistance to erosive gases in a process chamber. The corrosion resistance is provided by a composite structure 143 comprised of a porous ceramic material 144 and a fluorinated polymer 146. Desirably, the chamber wall 102 comprises a composite structure 143 at those regions of the interior surface of the chamber wall 102 that are at least partially exposed to process or cleaning gas or process byproducts. The composite structure 143 may be formed by applying a fluorinated polymer 145, for example a polymer, to a porous ceramic material 144, for example a porous ceramic material 144. The composite structure 143 provides a barrier to the energized gas to inhibit corrosion of the chamber wall 102. The composite structure 143 can also provide good adhesion of accumulated process residues to the chamber wall 102, thereby reducing substrate contamination.

Although exemplary embodiments of the present invention are shown and described, those of ordinary skill in the art may devise other embodiments which incorporate the present invention, and which are also within the scope of the present invention. For example, other suitable fluorinated polymers 145 may be used without deviating from the scope of the present invention. Also, the porous ceramic material 144 and fluorinated polymer 145 may be combined in different ways to form the composite structure 143, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A substrate processing chamber wall for processing a substrate in an energized gas, the wall comprising a composite structure including a porous ceramic material having open surface cores that are at least partially infiltrated with a fluorinated polymer.

2. A wall according to claim 1 wherein the composite structure is a portion of an enclosure for a substrate.

3. A wall according to claim 2 wherein the portion of the enclosure is a ceiling.

4. A wall according to claim 2 wherein the portion of the enclosure is a chamber liner.

5. A wall according to claim 1 wherein the porous ceramic material comprises a porosity of at least about 20%.

6. A wall according to claim 1 wherein the fluorinated polymer has a fluorine content of from about 50% to about 80% by weight.

7. A chamber according to claim 6 wherein the fluorinated polymer has a fluorine content of from about 67% to about 70% by weight.

8. A wall according to claim 1 wherein the volume fraction of fluorinated polymer to porous ceramic material is at least about 15%.

9. A wall according to claim 1 wherein the porous ceramic material is a coating.

10. A wall according to claim 1 wherein the porous ceramic material comprises one or more of aluminum oxide and silicon carbide.

11. A wall according to claim 1 wherein the fluorinated polymer forms a coating on a surface of the porous ceramic material.

12. A wall according to claim 1 wherein the fluorinated polymer is selected to be resistant to corrosion by energized gas.

13. A wall according to claim 12 wherein the fluorinated polymer is selected to be resistant to corrosion by an energized gas comprising oxygen-containing gas.

14. A wall according to claim 1 wherein the fluorinated polymer is formed by curing a liquid polymerizable material comprising one or more of vinylidenefluoride, hexafluoropropylene and tetrafluoroethylene.

15. A substrate processing chamber for processing a substrate in an energized gas, the chamber comprising:

a substrate support;

a gas supply;

a gas exhaust;

a gas energizer; and a wall about the substrate support, the wall comprising a porous ceramic material having open surface pores that are at least partially infiltrated with a fluorinated polymer, whereby a substrate on the substrate support may be processed by gas introduced by the gas supply, energized by the gas energizer, and exhausted by the gas exhaust.

16. A chamber according to claim 15 wherein the wall is an enclosure wall.

17. A chamber according to claim 16 wherein the enclosure wall is a ceiling.

18. A chamber according to claim 17 wherein the ceiling is adapted to be at least partially permeable to RF energy generated by the inductor coil, and wherein the gas energizer comprises an inductor coil about the ceiling.

19. A chamber according to claim 16 wherein the wall comprises a liner.

20. A chamber according to claim 15 wherein the porous ceramic material comprises a porosity of at least about 20%.

21. A chamber according to claim 15 wherein the volume fraction of fluorinated polymer to porous ceramic material is at least about 15%.

22. A chamber according to claim 15 wherein the porous ceramic material comprises one or more of aluminum oxide and silicon carbide.

23. A chamber according to claim 15 wherein at least a portion of the wall is exposed to energized gas.

24. A chamber according to claim 15, wherein the fluorinated polymer is formed by curing a liquid polymerizable material comprising one or more of vinylidenefluoride, hexafluoropropylene and tetrafluoroethylene.

25. A chamber according to claim 15 wherein the fluorinated polymer has a fluorine content of from about 50% to about 80% by weight.

26. A substrate processing chamber wall for processing a substrate in an energized gas, the wall comprising a composite structure including a porous ceramic material having open surface pores that are at least partially infiltrated with a fluorinated polymer, wherein the porous ceramic material comprises one or more of aluminum oxide and silicon carbide, and wherein the fluorinated polymer is formed by curing a liquid polymerizable material comprising one or more of vinylidenefluoride, hexafluoropropylene and tetrafluoroethylene.

27. A wall according to claim 26 wherein the composite structure is a portion of an enclosure wall.

28. A wall according to claim 26 wherein the composite structure is a portion of a chamber liner.

29. A substrate processing chamber enclosure wall for processing a substrate in an energized gas, the enclosure wall comprising a composite structure including a porous ceramic material having open surface pores that are at least partially infiltrated with a fluorinated polymer, wherein the porous ceramic material comprises a porosity of at least about 20%, and wherein the fluorinated polymer has a fluorine content of from about 50% to about 80% by weight.

30. An enclosure wall according to claim 29 wherein the porous ceramic material comprises one or more of aluminum oxide and silicon carbide, and wherein the fluorinated polymer is formed by curing a liquid polymerizable material comprising one or more of vinylidenefluoride, hexafluoropropylene and tetrafluoroethylene.

31. A substrate processing chamber liner for processing a substrate in an energized gas, the liner comprising a composite structure including a porous ceramic material having open surface pores that are at least partially infiltrated with a fluorinated polymer, wherein the porous ceramic material comprises a porosity of at least about 20%, and wherein the fluorinated polymer has a fluorine content of from about 50% to about 80% by weight.

32. A liner according to claim 31 wherein the porous ceramic material comprises one or more of aluminum oxide and silicon carbide, and wherein the fluorinated polymer is formed by curing a liquid polymerizable material comprising one or more of vinylidenefluoride, hexafluoropropylene and tetrafluoroethylene.

* * * * *